(12) United States Patent
Kale

(10) Patent No.: US 8,634,258 B2
(45) Date of Patent: Jan. 21, 2014

(54) REDUCED SIGNAL INTERFACE MEMORY DEVICE, SYSTEM, AND METHOD

(71) Applicant: Micron Technology, Inc., Boise, ID (US)

(72) Inventor: Poorna Kale, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/758,627

(22) Filed: Feb. 4, 2013

(65) Prior Publication Data

US 2013/0141980 A1 Jun. 6, 2013

Related U.S. Application Data

(62) Division of application No. 13/097,568, filed on Apr. 29, 2011, now Pat. No. 8,369,171, which is a division of application No. 12/334,523, filed on Dec. 15, 2008, now Pat. No. 7,948,821.

(51) Int. Cl.
*G11C 7/00* (2006.01)

(52) U.S. Cl.
USPC .................. 365/189.18; 365/189.12; 365/221

(58) Field of Classification Search
USPC ................................ 365/189.18, 189.12, 221
See application file for complete search history.

(56) References Cited

U.S. PATENT DOCUMENTS

| | | | |
|---|---|---|---|
| 5,384,645 A | | 1/1995 | Hasegawa et al. |
| 5,634,105 A | * | 5/1997 | Mizuno ...................... 711/211 |
| 6,035,345 A | * | 3/2000 | Lee .................................. 710/8 |
| 7,558,900 B2 | * | 7/2009 | Jigour et al. .................. 710/305 |
| 7,817,470 B2 | | 10/2010 | Kim |
| 7,948,821 B2 | | 5/2011 | Kale |
| 8,074,126 B1 | | 12/2011 | Qian et al. |
| 8,171,181 B2 | | 5/2012 | Lee et al. |
| 2009/0052555 A1 | | 2/2009 | Mak-Fan et al. |
| 2010/0149888 A1 | | 6/2010 | Kale |

* cited by examiner

*Primary Examiner* — Son Dinh
*Assistant Examiner* — Nam Nguyen
(74) *Attorney, Agent, or Firm* — Dorsey & Whitney LLP

(57) ABSTRACT

A memory has a serial interface. The serial interface is programmable to either use separate dedicated input and output pads, or to use one bidirectional pad. When one bidirectional pad is used, the interface signal count is reduced by one.

20 Claims, 8 Drawing Sheets

SERIAL MEMORY COMMANDS

| INSTRUCTION | OPCODE |
|---|---|
| Configure Device to BIDI mode | C8h |
| Serial Read | 03h |
| Serial Write | 02h |
| Write Status Regs | 01h |
| Read Status Regs | 05h |
| ⋮ | ⋮ |

BIDIRECTIONAL SERIAL READ

REDUCED SIGNAL INTERFACE MEMORY DEVICE, SYSTEM, AND METHOD

RELATED APPLICATIONS

This application is a divisional of pending U.S. patent application Ser. No. 13/097,568, filed Apr. 29, 2011, which application is a divisional of U.S. patent application Ser. No. 12/334,523, filed Dec. 15, 2008, and issued as U.S. Pat. No. 7,948,821 on May 24, 2011. These applications and patent are incorporated herein by reference, in their entirety, for any purpose.

BACKGROUND

Memory devices are typically accessed using electrical signals that are part of an "interface". Various types of memory device interfaces exist today. For example, some memory device interfaces have an address bus, a data bus, and control signals. The parallel nature of these memory device interfaces allow fast data transfer, but consume more area because of the large number of required signals. Other memory device interfaces combine the address bus and data bus to reduce the number of required interface signals. Some applications can benefit from these smaller memory device interfaces.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
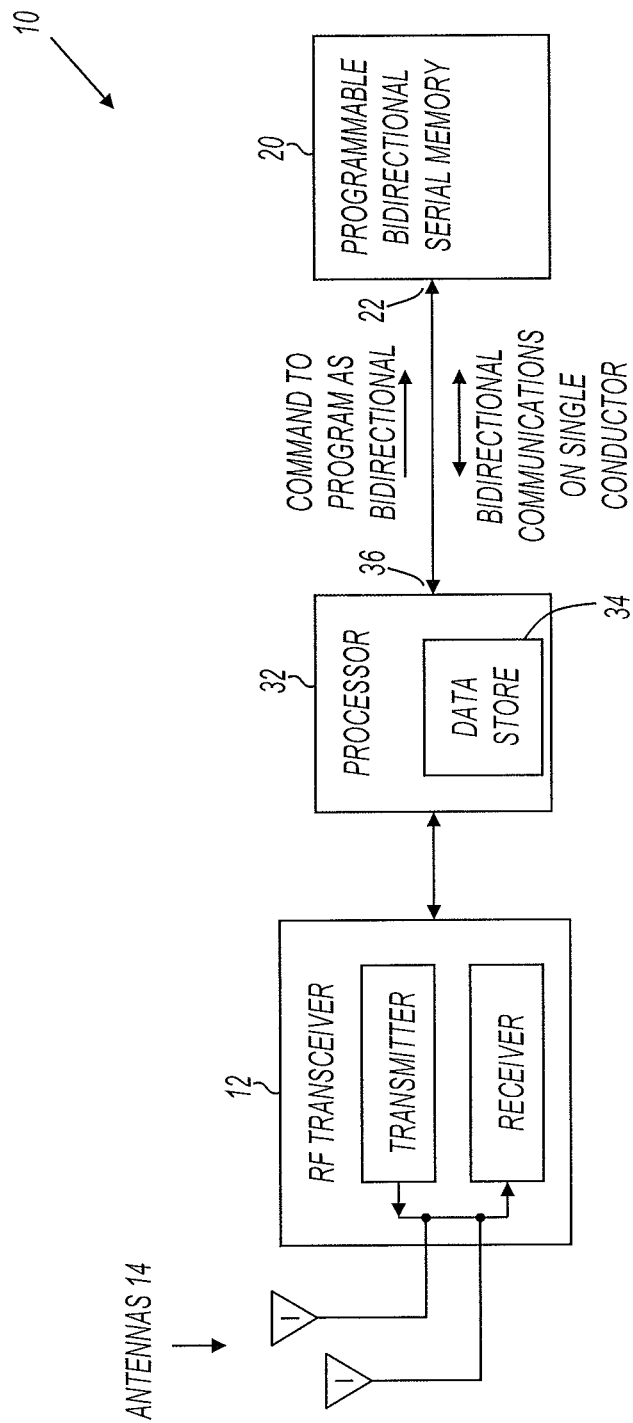
FIG. 1 illustrates a wireless communications device that incorporates a programmable bidirectional serial memory.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Some portions of the detailed description that follow are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations described herein. An apparatus may be specially constructed for the desired purposes, or it may comprise a general purpose computing device selectively activated or reconfigured by a program stored in the device. Such a program may be stored on a storage medium, such as, but not limited to, any type of disk including floppy disks, optical disks, compact disc read only memories (CD-ROMs), magnetic-optical disks, read-only memories (ROMs), random access memories (RAMs), electrically programmable read-only memories (EPROMs), electrically erasable and programmable read only memories (EEPROMs), magnetic or optical cards, or any other type of media suitable for storing electronic instructions, and capable of being coupled to a system bus for a computing device.

The processes and displays presented herein are not inherently related to any particular computing device or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the invention as described herein. In addition, it should be understood that operations, capabilities, and features described herein may be implemented with any combination of hardware (discrete or integrated circuits) and software.

Use of the terms "coupled" and "connected", along with their derivatives, may be used. It should be understood that these terms are not intended as synonyms for each other.

Rather, in particular embodiments, "connected" may be used to indicate that two or more elements are in direct physical or electrical contact with each other. "Coupled" may be used to indicate that two or more elements are in either direct or indirect (with other intervening elements between them) physical or electrical contact with each other, and/or that the two or more elements co-operate or interact with each other (e.g., as in a cause and effect relationship).

The wireless architecture embodiment illustrated in FIG. 1 shows a communications device 10 that includes a programmable bidirectional serial memory. It should be noted that the present invention is not limited to wireless communication embodiments and other, non-wireless applications may use programmable bidirectional serial memories in accordance with various embodiments of the present invention. As shown in this wireless embodiment, communications device 10 includes one or more antenna structures 14 to allow radios to communicate with other over-the-air communication devices. As such, communications device 10 may operate as a cellular device or a device that operates in wireless networks such as, for example, Wireless Fidelity (Wi-Fi) that provides the underlying technology of Wireless Local Area Network (WLAN) based on the IEEE 802.11 specifications, WiMax and Mobile WiMax based on IEEE 802.16-2005, Wideband Code Division Multiple Access (WCDMA), and Global System for Mobile Communications (GSM) networks, although the present invention is not limited to operate in only these networks. The radio subsystems collocated in the same platform of communications device 10 provide the capability of communicating with different frequency bands in an RF/location space with other devices in a network. It should be understood that the scope of the present invention is not limited by the types of, the number of, or the frequency of the communication protocols that may be used by communications device 10.

The embodiment illustrates the coupling of antenna structure 14 to a transceiver 12 to accommodate modulation/demodulation. In general, analog front end transceiver 12 may be a stand-alone Radio Frequency (RF) discrete or integrated analog circuit, or transceiver 12 may be embedded with a processor 32. Processor 32 may have one or more processor cores. Multiple processor cores allow processing workloads to be shared across the cores and handle baseband functions and application functions.

Programmable bidirectional serial memory 20 includes a serial port interface 22 to communicate with a serial port interface 36 of processor 32. Serial memory 20 may be programmed to operate with a dedicated "data in" signal and a dedicated "data out" signal, or may be programmed to operate with one bidirectional data signal. When programmed to operate with one bidirectional data signal, the interface signal count between processor 32 and memory 20 may be reduced by one.

In some embodiments, serial memory always includes a serial data out conductor and a serial data in conductor. Through programming, processor 32 informs memory 20 whether both conductors are going to be used, or if one of the conductors is to be shared for bidirectional communications. In the example shown in FIG. 1, processor 32 sends a command to memory 20 to program the memory as bidirectional. After programming, processor 32 and memory 20 perform bidirectional communications on a single conductor.

Processor 32 is shown including data store 34. Data store 34 may include memory such as RAM or ROM, or may include registers or other storage mechanisms. Data store 34 may have hold commands used to configure memory 34. For example, data store 34 may include commands to program configuration and/or status registers within memory 20. Also for example, data store 34 may include a command to program memory 20 for bidirectional operation. Upon power up, processor 32 may send the command(s) in data store 34 to memory 20.

Memory 20 may optionally be used to store instructions that are executed by the processor during the operation of wireless communication device 10, and may be used to store user data such as the conditions for when a message is to be transmitted by wireless communication device 10 or the actual data to be transmitted. For example, the instructions stored in memory 20 may be used to perform wireless communications, provide security functionality for communication device 10, user functionality such as calendaring, email, interne browsing, etc.

Figure 2:
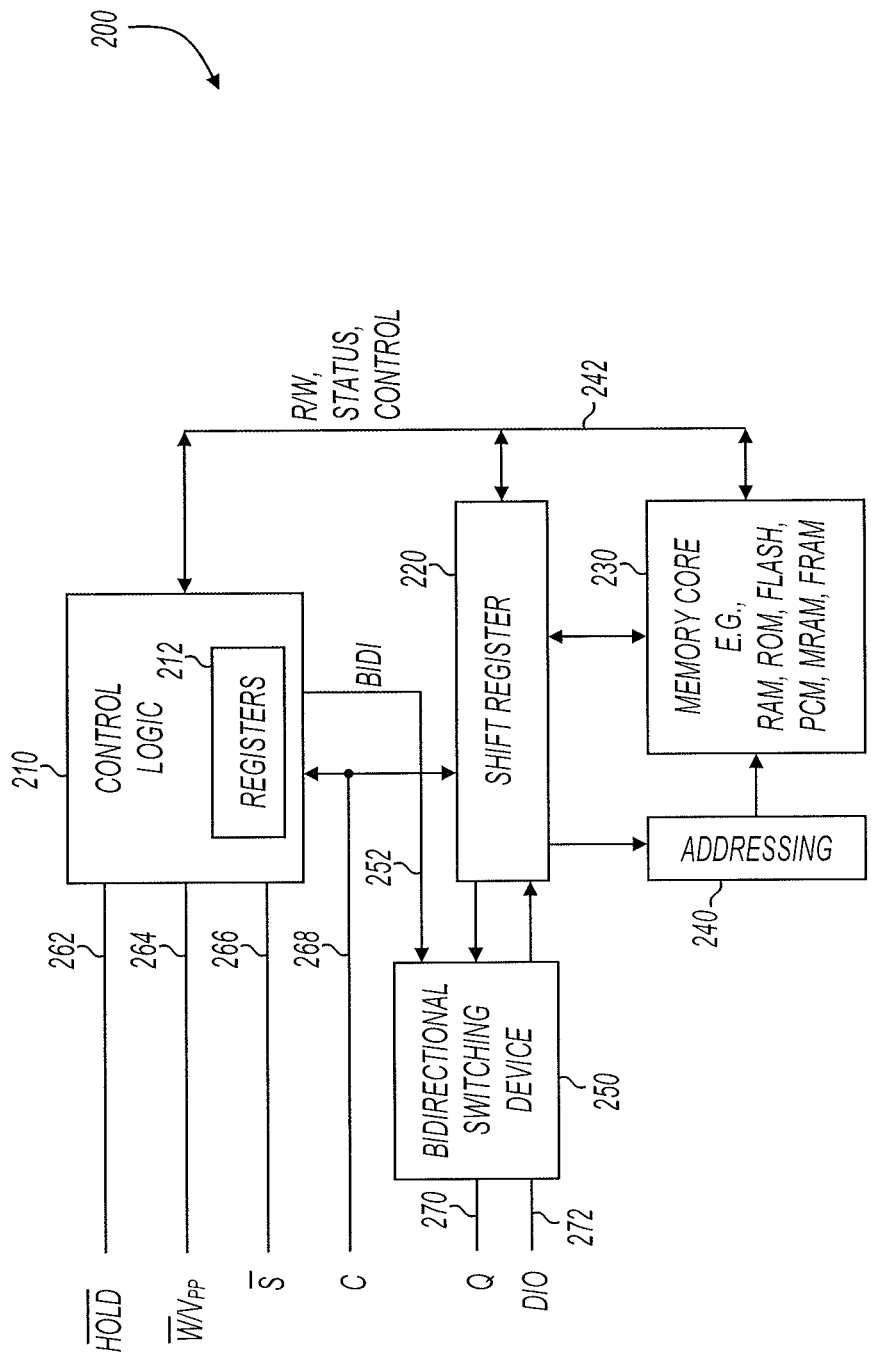
FIGS. 2-4 show programmable bidirectional serial memories in accordance with various embodiments of the present invention.

FIG. 2 shows a programmable bidirectional serial memory in accordance with various embodiments of the present invention. Memory 200 may be used in any system, including a wireless device. For example, memory 200 may be used as memory 20 (FIG. 1). Memory 200 includes memory core 230, address decoders 240, shift register 220, bidirectional switching device 250, and control logic 210. Control logic 210 includes configuration/status registers 212. In operation, bidirectional switching device 250 allows programmable bidirectional serial memory 200 to be accessed with one less interface signal. This is described in more detail below.

Memory core 230 may include one or more different types of memory. For example, memory core 230 may include volatile and/or nonvolatile memory. Examples of volatile memory include Static Random Access Memory (SRAM) and Dynamic Random Access Memory (DRAM). Examples of nonvolatile memory include FLASH memory, Phase Change Memory (PCM), Magnetic Random Access Memory (MRAM), and Ferroelectric Random Access Memory (FRAM).

FLASH memory stores information by storing charge on a floating gate in a Metal Oxide Semiconductor (MOS) transistor. The stored charge alters the threshold voltage of the transistor, and the difference in threshold voltage is "read" to determine whether the stored information is a "0" or a "1". In some embodiments varying amounts of charge are stored on the floating gate to represent more than one bit of information per memory cell. This is sometimes referred to as Multi-Level Cell (MLC) FLASH.

Phase change memories are memories that store information based on modifiable material properties, such as whether a material is in a crystalline or amorphous state (phase). For example, in some embodiments, phase change memories include alloys of elements of group VI of the periodic table, such as Te or Se, that are referred to as chalcogenides or chalcogenic materials. Chalcogenides may be used advantageously in phase change memory cells to provide data retention and remain stable even after the power is removed from the nonvolatile memory. Taking the phase change material as Ge2Sb2Te5 for example, two phases or more are exhibited having distinct electrical characteristics useful for memory storage. Phase change memory may be referred to as a Phase Change Memory (PCM), Phase-Change Random Access Memory (PRAM or PCRAM), Ovonic Unified Memory (OUM) or Chalcogenide Random Access Memory (C-RAM).

Magnetic Random Access Memory (MRAM) have magnetic storage elements formed from two ferromagnetic plates located at an intersection of a row and column line and selected by a Magnetic Tunnel Junction (MTJ) device. Current imparted to the row line in one direction causes a magnetic field operative on the MRAM cell biasing the MRAM cell toward a binary state. Due to a magnetic tunnel effect, the electrical resistance of the memory cell changes based on the orientation of the fields in the two plates.

Ferro-electric Random Access Memory (FRAM) have memory cells that may include one transistor and one capacitor. The capacitor includes ferroelectric material and a bi-stable atom in the fenoelectric material is shifted to form two stable polarization states. Memory cell data may be written by positively or negatively orienting the dipoles of the ferroelectric material via an applied polarizing voltage. Data may be read by detecting the voltage of the bit line (BL) connected with the memory cell. Current feed circuits supply electric currents to the bit lines for a predetermined period from a start of a read operation, and read control circuitry senses the direction of the electric polarization as either a high or a low logic state. Each orientation is stable and remains in place even after the electric field is removed, preserving the data within the memory without periodic refresh.

Memory 200 is shown having up to six interface signals: the HOLD signal on node 262, the Write Protect/Enhanced Program supply voltage (W/VPP) on node 264, the chip select (S) on node 266, the serial clock (C) on node 268, the serial data output (Q) on node 270, and the programmable bidirectional data input (DIO) on node 272.

Shift register 220 receives commands, address, and data on a serial data input node. Commands may have many different purposes. For example, some commands are used to write and read registers 212. Other commands are used to write and read the contents of memory core 230.

Bidirectional switching device 250 allows memory 200 to be operated in a non-bidirectional mode in which Q is a dedicated serial output and DIO is a dedicated serial input, and also allows memory 200 to be operated in a bidirectional mode in which DIO is a bidirectional serial signal, and Q is unused. By programming memory 200 to operate bidirectionally, the interface signal count is reduced by one.

The chip select (S) is asserted low when memory 200 is to be accessed, and the serial clock (C) provides the timing of the serial interface. Instructions, addresses, or data present at the serial data input (DIO) are latched on the rising edge of the serial clock (C). Data on the serial data output (Q) (or DIO when operating bidirectionally) changes after the falling edge of Serial Clock (C).

The HOLD signal is used to pause any serial communications with the device without deselecting the device. W/VPP is both a control input and a power supply pin. The two functions are selected by the voltage range applied to the pin. If the W/VPP input is kept in a low voltage range (0V to VCC) the pin is seen as a control input used to freeze the size of the protected area of the memory core. If the W/VPP is a high voltage (generally higher than VCC), it acts as an additional power supply pin useful for erasing the memory in FLASH embodiments. In some embodiments, the HOLD signal and the W/VPP signal are omitted. In these embodiments, the serial interface includes either three or four signals depending on whether the bidirectional mode is selected.

When the bidirectional mode is selected, the BIDI signal on node 252 is asserted at the appropriate time intervals to cause DIO to reverse direction. For example, the BIDI signal may be de-asserted when DIO is functioning as an input pad, and the BIDI signal may be asserted when DIO is functioning as an output pad.

Figure 3:
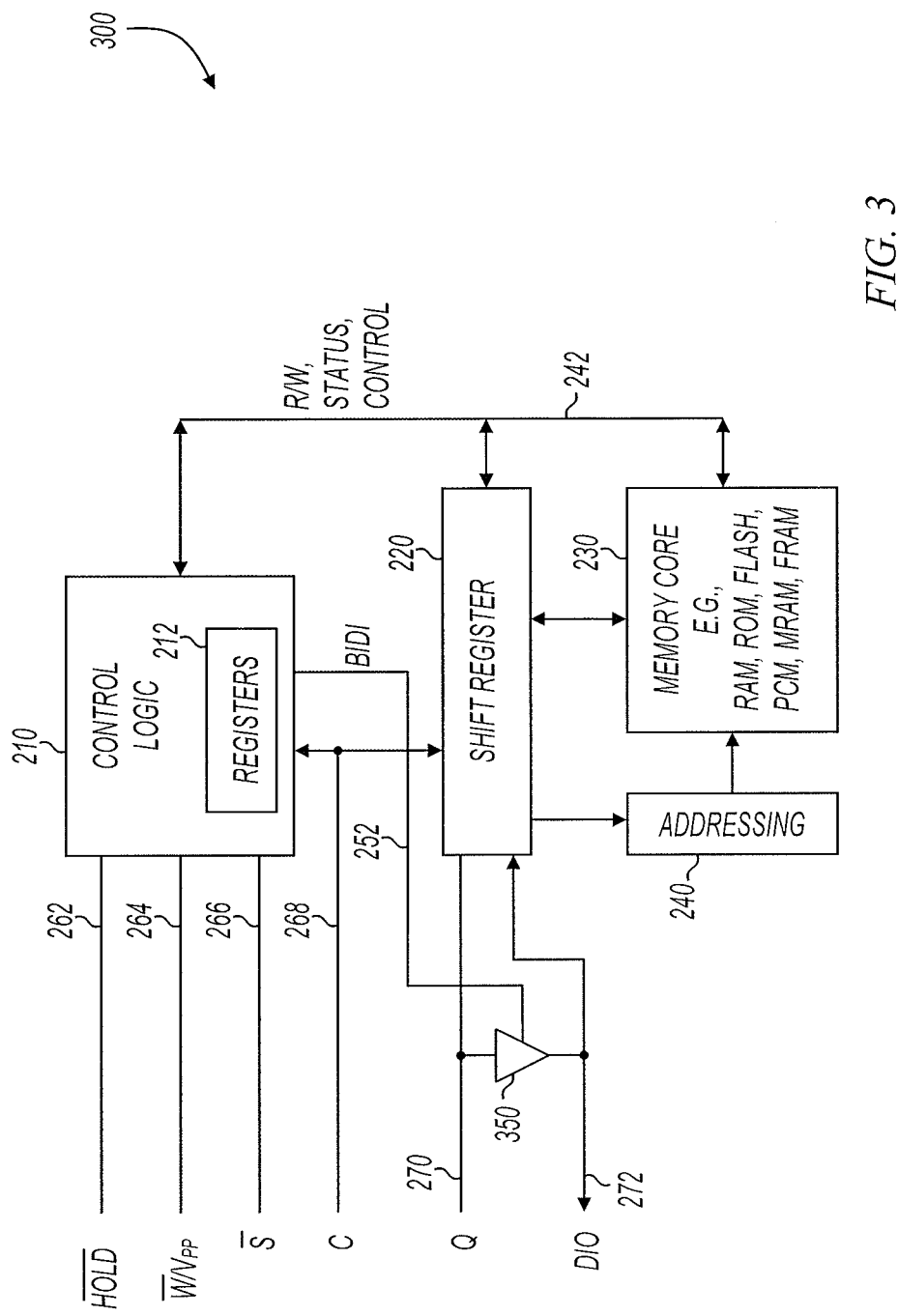
Figure 4:
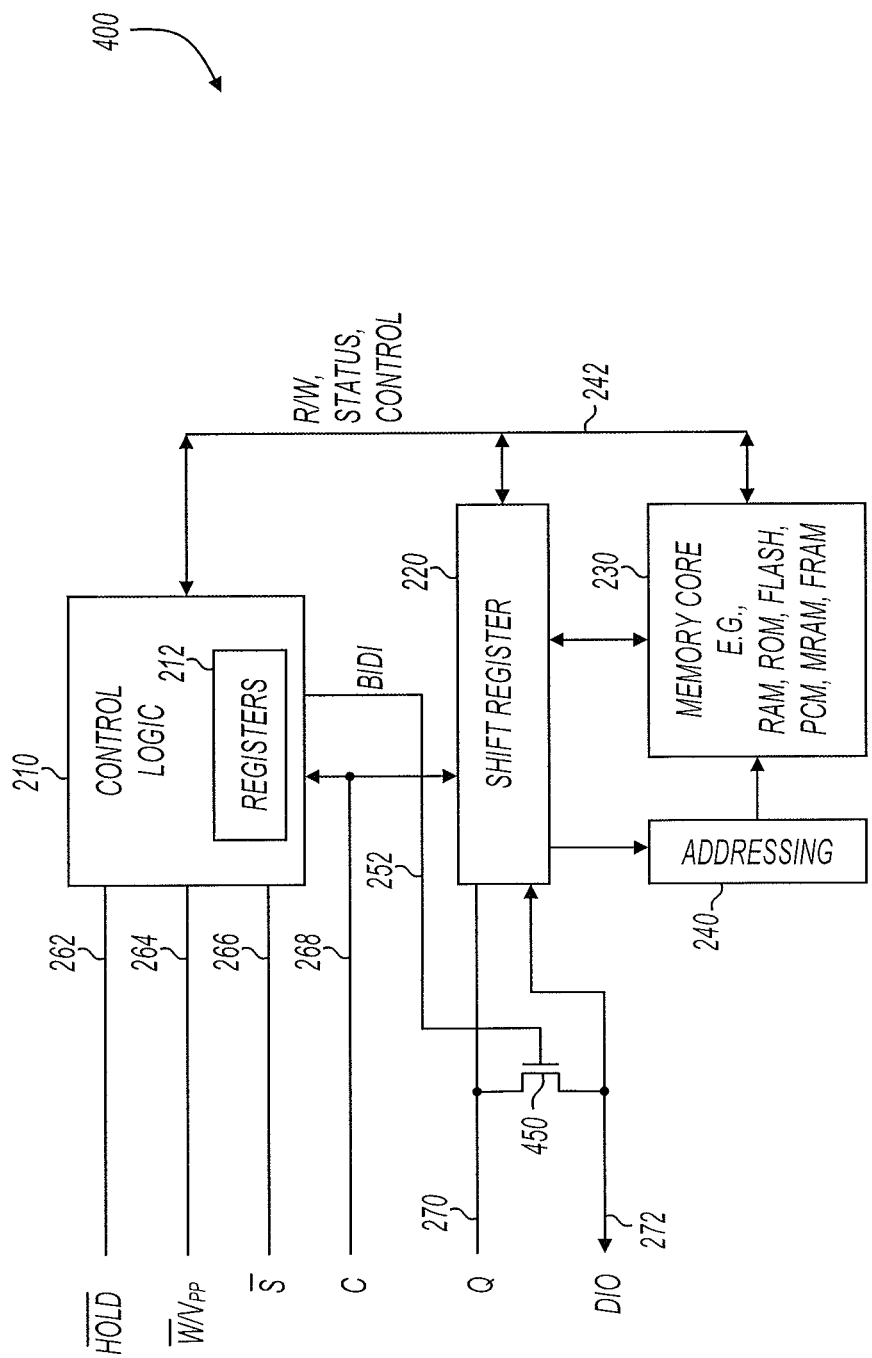

FIGS. 3 and 4 show alternate embodiments of programmable bidirectional serial memory devices. In FIG. 3, memory 300 includes a tri-state buffer 350 as the bidirectional switching device. When the BIDI signal is asserted, tri-state buffer 350 is turned on, and DIO is driven with the output data that would otherwise appear on Q. In FIG. 4, memory 400 includes a transistor switch 450 for the bidirectional switching device. When the BIDI signal is asserted, the data drive on Q also appears on DIO.

Figures 5, 6:
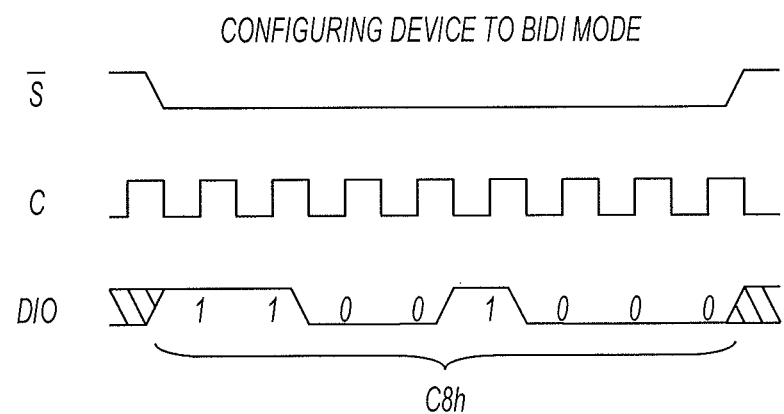
FIG. 5 shows example serial memory commands including a command used to program a serial memory for bidirectional operation.
FIG. 6 shows the operation of programming the serial memory for bidirectional operation.

FIG. 5 shows example serial memory commands including a command used to program a serial memory for bidirectional operation. Each command includes an opcode. For example, the opcode to configure the memory into a bidirectional mode is C8 hexadecimal, or 11001000 binary. To execute any given command, the corresponding opcode is shifted serially into the memory. FIG. 5 shows five commands, but this is not a limitation of the present invention. Any number of commands may be supported by the serial memory.

FIG. 6 shows the operation of programming the serial memory for bidirectional operation. The chip select (S) is taken low, and for eight consecutive clock cycles, the opcode C8h is presented on DIO. Referring now back to FIGS. 2-4, the opcode C8h is shifted into shift register 220, and provided to control logic 210 via control bus 242. Control logic 210 configures itself for bidirectional operation as a result. In some embodiments, registers 212 include one or more bits that specify whether the bidirectional mode is selected. Once the bidirectional mode is selected, DIO is bidirectional, and Q is not used. The bidirectional operation is illustrated in FIG. 7.

Figure 7:
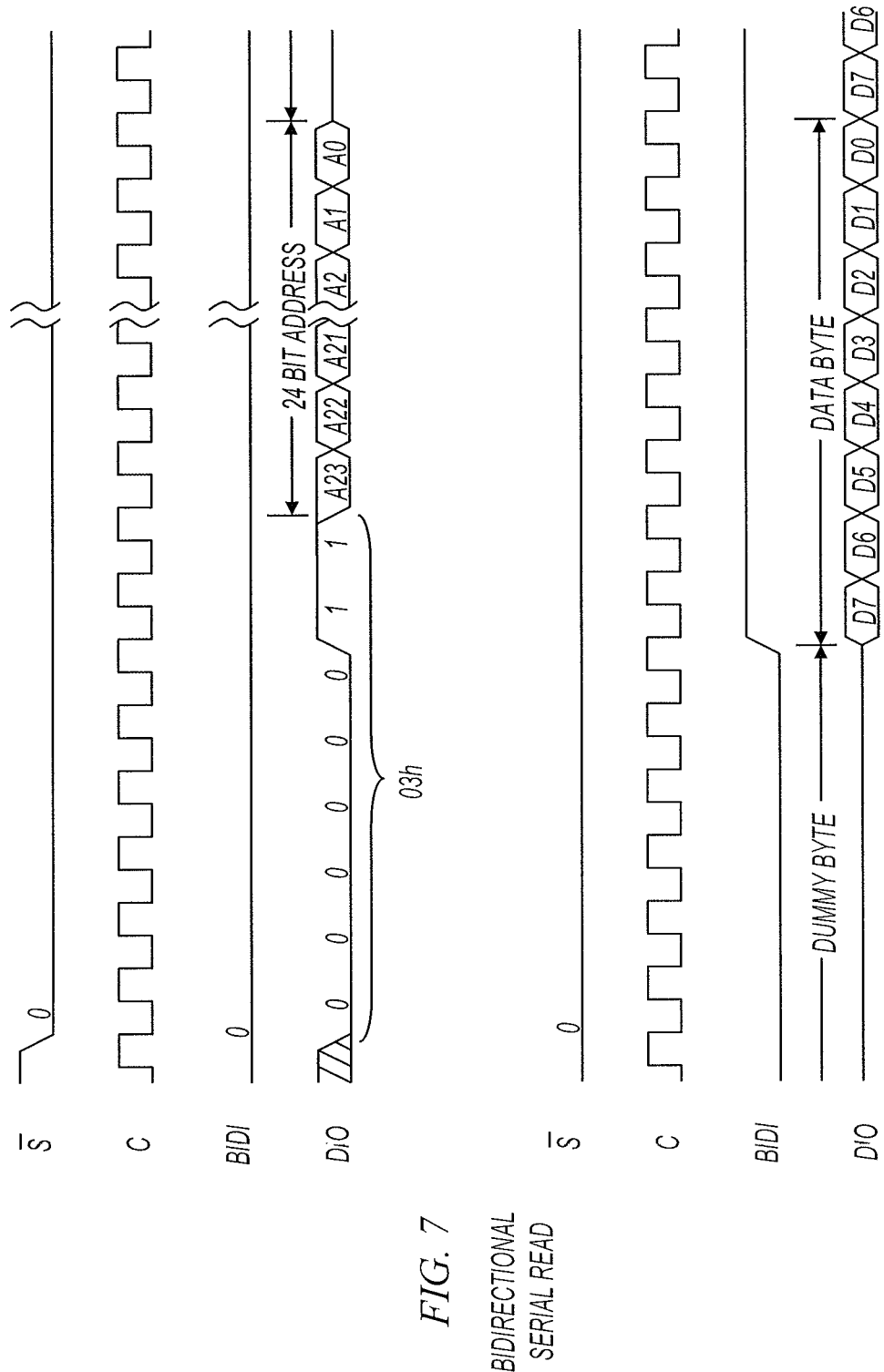
FIG. 7 shows bidirectional operation of a serial memory.

FIG. 7 shows bidirectional operation of a serial memory. FIG. 7 shows external signals S, C, and DIO, and also shows internal signal BIDI. Time advances left-to-right, and from top-to-bottom. The chip select signal S is asserted low, and the read command 03h is shifted in on DIO. Following the read command, a 24 bit address field is shifted in. After a dummy byte period on DIO, data is shifted out as long as the chip select is continued to be asserted low. Just prior to the data shifting out, BIDI is asserted to drive DIO bidirectionally.

The turn-around time between DIO being an input and an output is shown in FIG. 7 as one byte, although this is not a limitation of the present invention. For example, the turn-around time may be more or less than one byte period. In some embodiments, the serial memory is a byte oriented device, and the turn-around time is an integer multiple of byte periods.

By programming the serial memory to utilize the DIO signal as a bidirectional signal, the Q signal is not needed, and the memory interface signal count is reduced by one.

Figure 8:
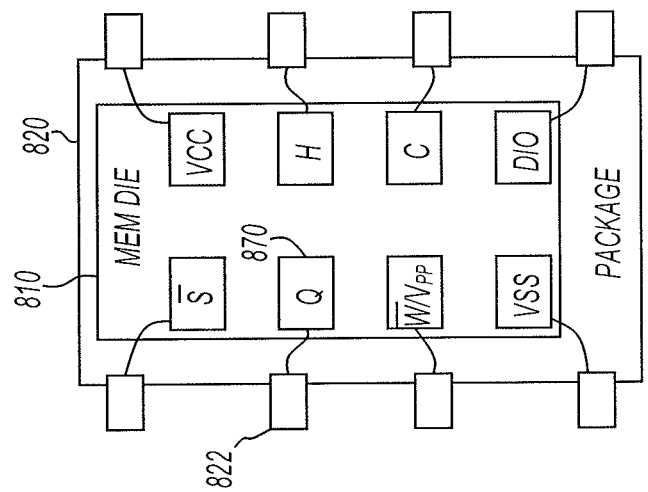
FIGS. 8-10 show packaged memory devices in accordance with various embodiments of the present invention.
Figure 9:
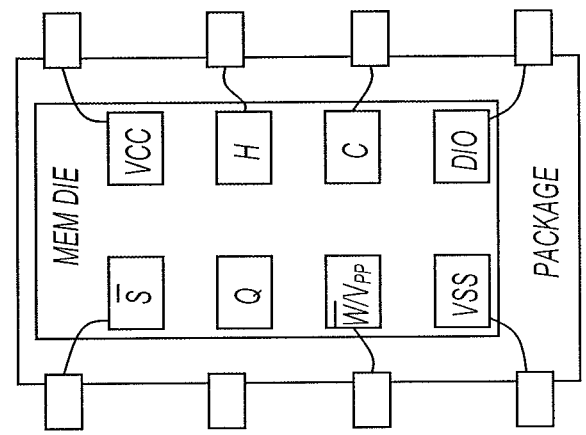
Figure 10:
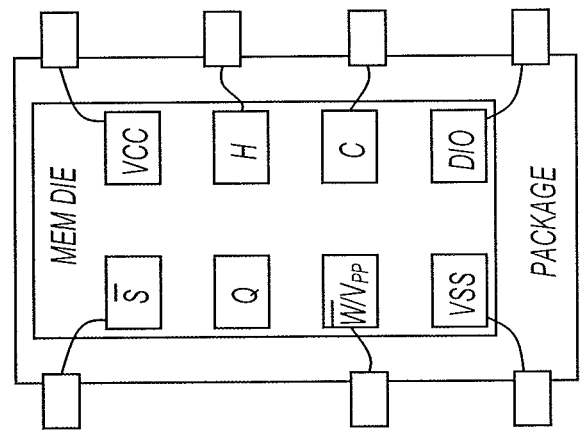

FIGS. 8-10 show packaged memory devices in accordance with various embodiments of the present invention. Memory die 810 corresponds to one of programmable bidirectional serial memories 20, 200, 300, or 400 (FIGS. 1-4). Die 810 includes eight pads bonded to pins of package 820. Pads include power supplies VCC and VSS, and the six interface signals described above (HOLD, W/VPP, S, C, Q, DIO). As shown in FIG. 8, all pads of die 810 are bonded to package pins (conductors), including pad 870 (Q) being bonded to pin 822.

In embodiments represented by FIG. 8, the Q signal is exposed at a package pin, but when the memory device is programmed as bidirectional, the Q pin is not used. Accordingly, the packaged device in FIG. 8 may be used as a non-bidirectional device or a bidirectional device depending on how it is interconnected and whether a bidirectional command is sent to the memory.

In FIG. 9, the Q pad is left unbonded. The package includes a pin corresponding to the Q pad, but it is unused. In FIG. 10, the package does not include a pin corresponding to the Q pad. As shown in FIGS. 8-10, the same programmable bidirectional serial memory die may be packaged in many different ways. In some embodiments, the memory die is packaged using bond wires, and in other embodiments, the memory die is packaged as a flip chip. In further embodiments, the memory die is packaged with additional integrated circuit dice. For example, processor 32 (FIG. 1) may be packaged with memory die 810 in the same package.

Figure 11:
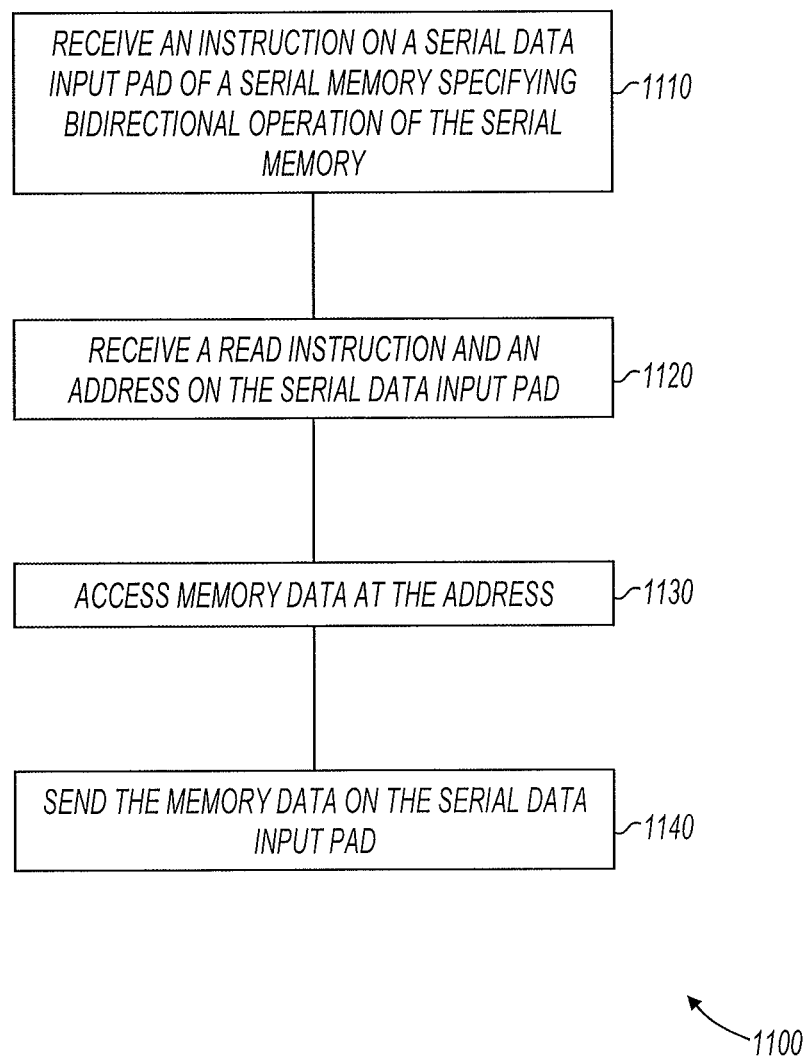
FIG. 11 shows a flowchart in accordance with various embodiments of the present invention.

FIG. 11 shows a flowchart in accordance with various embodiments of the present invention. In some embodiments, method 1100, or portions thereof, is performed by a programmable bidirectional serial memory, embodiments of which are shown in previous figures. In other embodiments, method 1100 is performed by a controller within a serial memory device, an integrated circuit, or an electronic system. Method 1100 is not limited by the particular type of apparatus performing the method. The various actions in method 1100 may be performed in the order presented, or may be performed in a different order. Further, in some embodiments, some actions listed in FIG. 11 are omitted from method 1100.

Method 1100 is shown beginning with block 1110 in which an instruction is received on a serial data input pad of a serial memory specifying bidirectional operation of the serial memory. This may correspond to a serial memory receiving a command as shown in FIG. 6.

At 1120, a read instruction and an address are received on the serial data input pad as shown in FIG. 7. At 1130, memory data is accessed at the address within the memory, and at 1140, the memory data is sent on the serial data input pad. This corresponds to bidirectional operation of a serial data signal on the serial port of a programmable bidirectional serial memory. The memory may include volatile or nonvolatile memory, including for example RAM, ROM, FLASH, PCM, MRAM, or FRAM.

Although the present invention has been described in conjunction with certain embodiments, it is to be understood that modifications and variations may be resorted to without departing from the scope of the invention as those skilled in the art readily understand. Such modifications and variations are considered to be within the scope of the invention and the appended claims.

What is claimed is:

1. A memory comprising:
   a serial data in pad and a serial data out pad;
   circuitry configured to configure one of the serial data in pad or the serial data out pad to operate as a bidirectional serial data pad; and
   a control unit coupled to the serial data in pad, the control unit configured to receive serial instructions and to configure the circuitry for bidirectional operation.

2. The memory of claim 1, further comprising a package, wherein only one of the serial data in and serial data out pad is bonded to the package.

3. The memory of claim 1, further comprising:
   a serial shift register coupled to the serial data in pad and the serial data out pad; and
   a nonvolatile memory core coupled to the serial shift register.

4. The memory of claim 3, wherein the nonvolatile memory core comprises FLASH memory.

5. The memory of claim 3, wherein the nonvolatile memory core comprises phase change memory.

6. The memory of claim 1, wherein the control unit configured to configure the circuitry for bidirectional operation is responsive to receiving an instruction via the serial data in pad.

7. The memory of claim 6, wherein the control unit is configured to configure the circuitry for full duplex operation responsive to receiving a second instruction via the serial data in pad.

8. A memory comprising:
   circuitry coupled to a serial data in pad and a serial data out pad, the circuitry configured to enable bidirectional communication on one of the serial data in pad or the serial data out pad; and
   a control unit coupled to the serial data in pad and configured to control the circuitry to operate in one of a bidirectional mode or a full duplex mode.

9. The memory of claim 8, wherein the control unit is configured to receive serial instructions from a processor, wherein the control unit configured to control the circuitry to operate in one of the bidirectional mode or the full duplex mode is based on the serial instructions.

10. The memory of claim 8, wherein the control unit configured to control the circuitry to operate in one of the bidirectional mode or the full duplex mode comprises the control unit configured to provide a control signal to the circuitry.

11. The memory of claim 10, wherein the circuitry configured to enable bidirectional communication on the one of the serial data in pad or the serial data out pad is responsive to the control signal having a first value.

12. The memory of claim 11, wherein the circuitry is further configured enable full duplex communication on the serial data in pad and the serial data out pad responsive to the control signal having a second value.

13. The memory of claim 8, wherein the circuitry configured to enable bidirectional communication on the one of the serial data in pad or the serial data out pad comprises the circuitry coupling the serial data in pad to the serial data out pad.

14. The memory of claim 13, wherein the circuitry comprises one of a tri-state inverter or a transistor.

15. A method comprising:
    enabling bidirectional communication on a first serial port of a memory responsive to a signal from a control unit of the memory having a first value; and
    enabling full duplex communication on the first serial port and a second serial port responsive to the signal from the control unit having a second value.

16. The method of claim 15, further comprising:
    setting the signal to the first value responsive to receiving a first instruction; and
    setting the signal to the second value responsive to receiving the second instruction.

17. The method of claim 15, wherein enabling the bidirectional communication on the serial port comprises coupling the first serial port to the second serial port.

18. The method of claim 17, wherein coupling the first serial port to the second serial port comprises turning on a tri-state buffer.

19. The method of claim 17, wherein coupling the first serial port to the second serial port comprises closing a transistor switch.

20. The method of claim 17, the first serial data port comprises a bidirectional data port and the second serial data port comprises a serial data out port.

* * * * *